(12) United States Patent
Le et al.

(10) Patent No.: US 7,788,211 B2
(45) Date of Patent: Aug. 31, 2010

(54) ROBUST AND EFFICIENT COMPRESSION OF LIST OF ITEMS

(75) Inventors: Khiem Le, Coppell, TX (US); Haihong Zheng, Coppell, TX (US); Zhigang Liu, Irving, TX (US)

(73) Assignee: Nokia Networks Oy, Espoo (FI)

( * ) Notice: Subject to any disclaimer, the term of this patent is extended or adjusted under 35 U.S.C. 154(b) by 271 days.

(21) Appl. No.: 09/756,232

(22) Filed: Jan. 9, 2001

(65) Prior Publication Data

US 2002/0089437 A1 Jul. 11, 2002

Related U.S. Application Data

(60) Provisional application No. 60/211,986, filed on Jun. 16, 2000.

(51) Int. Cl.
*G06F 17/30* (2006.01)

(52) U.S. Cl. ............... 707/101; 707/6; 707/200; 709/247; 709/236; 382/244; 380/270

(58) Field of Classification Search ........... 707/7, 707/6, 511, 101, 200, 1, 10, 100, 204; 709/218, 709/247, 236; 382/244; 370/230, 235, 392, 370/465, 395.1; 380/270
See application file for complete search history.

(56) References Cited

U.S. PATENT DOCUMENTS

| | | | | |
|---|---|---|---|---|
| 5,481,712 A * | 1/1996 | Silver et al. | ............... | 717/109 |
| 5,579,316 A * | 11/1996 | Venters et al. | ............... | 370/392 |
| 5,826,252 A * | 10/1998 | Wolters et al. | ............... | 707/1 |
| 5,864,860 A * | 1/1999 | Holmes | ............... | 707/101 |
| 6,028,962 A * | 2/2000 | Claassen et al. | ............... | 382/239 |
| 6,073,170 A * | 6/2000 | Sumita et al. | ............... | 709/218 |
| 6,173,291 B1 * | 1/2001 | Jenevein | ............... | 707/200 |
| 6,181,807 B1 * | 1/2001 | Setlak et al. | ............... | 382/124 |
| 6,216,140 B1 * | 4/2001 | Kramer | ............... | 715/511 |
| 6,300,887 B1 * | 10/2001 | Le | ............... | 341/60 |
| 6,343,318 B1 * | 1/2002 | Hawkins et al. | ............... | 709/219 |
| 6,397,259 B1 * | 5/2002 | Lincke et al. | ............... | 709/236 |
| 6,446,068 B1 * | 9/2002 | Kortge | ............... | 707/6 |
| H2051 H * | 11/2002 | Zhu et al. | ............... | 370/395.21 |
| 6,477,669 B1 * | 11/2002 | Agarwal et al. | ............... | 714/708 |
| 6,535,925 B1 * | 3/2003 | Svanbro et al. | ............... | 709/247 |
| 6,542,931 B1 * | 4/2003 | Le et al. | ............... | 709/228 |
| 6,680,955 B1 * | 1/2004 | Le | ............... | 370/477 |
| 6,711,164 B1 * | 3/2004 | Le et al. | ............... | 370/392 |
| 6,782,047 B1 * | 8/2004 | Le et al. | ............... | 375/240 |
| 6,882,637 B1 * | 4/2005 | Le et al. | ............... | 370/349 |

(Continued)

OTHER PUBLICATIONS

U.S. Appl. No. 60/164,355, "Packet hearder compression using division remainder".*

(Continued)

*Primary Examiner*—Jean M Corrielus
(74) *Attorney, Agent, or Firm*—Mintz, Levin, Cohn, Ferris, Glovsky, and Popeo, P.C.

(57) ABSTRACT

A method and apparatus are provided for communicating information. This may include comparing a current item list with a reference item list and determining a type of classification based on the comparison. That is, the comparison may determine a difference between the current item list and the reference item list. Information regarding this difference may be sent from a first entity to a second entity.

42 Claims, 7 Drawing Sheets

| 62 | 64 | 84 | 85 | | | | | | |
|---|---|---|---|---|---|---|---|---|---|
| ET = "101" | ref_id | rft | charge order | c_item 1 | ------ | c_item m1 | aft | insertion order | c_item 1 | ------ | c_item m2 |

U.S. PATENT DOCUMENTS

| | | | |
|---|---|---|---|
| 7,010,032 B1 * | 3/2006 | Kikuchi et al. | 375/240.01 |
| 7,046,672 B2 * | 5/2006 | Liao et al. | 370/395.1 |
| 7,061,936 B2 * | 6/2006 | Yoshimura et al. | 370/474 |
| 7,106,733 B2 * | 9/2006 | Fleming | 370/389 |
| 7,290,063 B2 * | 10/2007 | Kalliokulju et al. | 709/247 |
| 2002/0001315 A1 * | 1/2002 | Tran et al. | 370/475 |
| 2002/0023109 A1 * | 2/2002 | Lederer et al. | 707/511 |
| 2002/0064190 A1 * | 5/2002 | Sikora et al. | 370/537 |
| 2002/0126675 A1 * | 9/2002 | Yoshimura et al. | 370/395.21 |
| 2002/0142757 A1 * | 10/2002 | Leung et al. | 455/412 |

OTHER PUBLICATIONS

Acticom ROHC, "Robust header compression", release 5.*
Svanbro et al., wireless real-time IP services enabled by header compresion.*
Price et al., "Enhanced TCP/IP compression for ROHC draft-price-rohc-03.txt", Feb. 22, 2002.*
Zheng, H, "Generic Scheme for Item List" ROHC News, 'Online!' Jun. 22, 2000, pp. 1-9.
Zheng, H., "ipv6 ext hc" ROHC News List, 'Online!', Jun. 23, 2000, pp. 1-19.
Bormann C. et al., "Robust Header Compression (ROHC)" Internet Draft 'Online!', Nov. 24, 2000, pp. 1-156.

* cited by examiner

| ET = "110" | ref_id | rft | removal order | cft | charge order | c_item 1 | ------ | c_item m |
|---|---|---|---|---|---|---|---|---|

| ET = "11" | ref_id | c_item count | rft | removal order | aft | insertion order | c_item A | c_item D |
|---|---|---|---|---|---|---|---|---|

| ET = "00" | ref_id | c_item count | c_item A | c_item C | c_item B | c_item D |
|---|---|---|---|---|---|---|

| 11 | A (uncompressed value) |
|---|---|

FIG. 21

| 0 | 01 |
|---|---|

FIG. 22

| 10 | 00 | compressed B' |

FIG. 23

| 11 | D (uncompressed value) |

ROBUST AND EFFICIENT COMPRESSION OF LIST OF ITEMS

This application claims priority from U.S. Provisional Application No. 60/211,986, filed Jun. 16, 2000, and entitled "Robust and Efficient Compression of List of Items," the subject matter of which is incorporated herein by reference.

FIELD OF THE INVENTION

The present invention relates to compression of a list of items.

BACKGROUND OF RELATED ART

Internet Protocol (IP) is widely used in different types of networks. For example, for IP based real-time multimedia, Real-Time Transfer Protocol (RTP) is predominantly used on top of User Datagram Protocol (UDP) and IP version 4 (IPv4) or IP version 6 (IPv6). However, due to the large size of IP/UDP/RTP header, which is undesirable in low bandwidth networks such as wireless networks, suitable header compression schemes are needed.

Header compression algorithms are based on the observation that most fields of the IP packet headers remain constant in a packet stream during the length of a session. Thus, it is possible to compress the header information by establishing a context at both compressor and decompressor and by simply carrying a minimal amount of header information from the compressor to the decompressor. Header compression schemes need to be robust so that they can tolerate loss and residual errors on the link over which header compression takes place without losing additional packets or introducing additional errors in the decompressed headers.

There are several types of item lists inside IP/UDP/RTP headers. Item lists include a list of items. Examples include, but are not limited to, Contributing Source (CSRC) list in RTP header, IPv6 Extension Header Chain, Address List in type 0 Routing Header. The Internet Engineering Task Force (IETF) Robust Header Compression (ROHC) Working Group recognizes the problem of how to compress an item list that may vary in composition from application to application. It is desirable to obtain a general and efficient solution applicable to different types of header fields or different applications.

SUMMARY OF THE INVENTION

To solve the above and other problems, embodiments of the present invention may provide a method of communicating information. The method may include comparing a current item list with a reference item list and determining a type of classification based on the comparison. A difference may be determined between the current item list and the reference item list and this difference may be sent from a first entity to a second entity. Information regarding the difference may be encoded prior to sending the information from the first entity to the second entity.

A compressed list may be sent from a first entity to a second entity. The compressed list may include information regarding the difference between the current item list and the reference item list. The difference may be encoded within the compressed list based on the determined type of classification. The type of classification may be based on one of: whether an item in the reference item list is in the current item list, whether the item is in the reference item list and whether contents of the item in the current item list are the same as contents of the item in the reference item list.

In at least one embodiment, a difference may be determined between one item in the current item list and a corresponding item in the reference item list. This difference may be sent from one entity to the other entity.

The method may also include sending the reference item list from a first entity to a second entity. Information sent from the first entity to the second entity may be decompressed using the previously sent reference item list as a reference.

Embodiments of the present invention may also provide a device to communicate information that includes a processor device to classify at least one item of a list and to form a compressed list including the at least one item. A transmitting device may transmit the compressed list. Further, an encoding device may encode information for transmission by the transmitting device to another entity.

Other objects advantages and salient features of the invention will become apparent from the following detailed description taken in conjunction with the annexed drawings, which disclose preferred embodiments of the invention.

BRIEF DESCRIPTION OF THE DRAWINGS

The present invention will be described with respect to the exemplary figures in which like reference numerals refer to like elements and wherein.

DETAILED DESCRIPTION OF PREFERRED EMBODIMENTS

Figure 1:
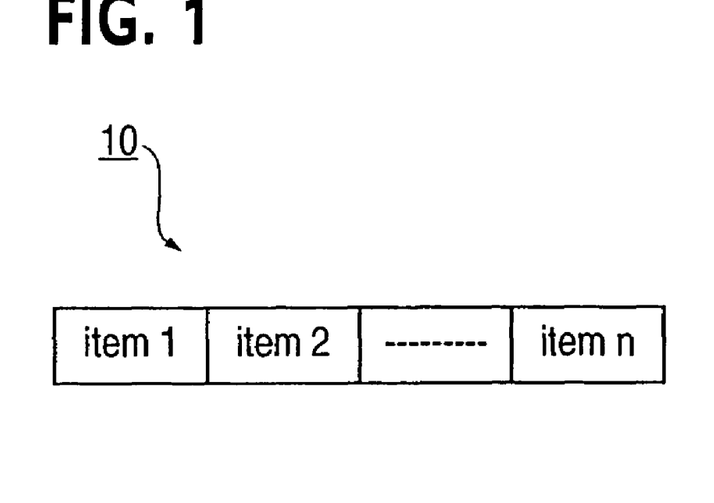
FIG. 1 shows a generic structure of an item list.

An item list may specify a set of items that is order sensitive. For example, FIG. 1 shows a generic structure of an item list 10 that includes n items numbered 1 to n. Items within the item list 10 may or may not have the same structure. One example of a first case is a Contributing Source (CSRC) list in the Realtime Transport Protocol (RTP) header or an address list in Type 0 IPv6 Routing Header. An example of a second case is an IPv6 extension header.

Figure 2:
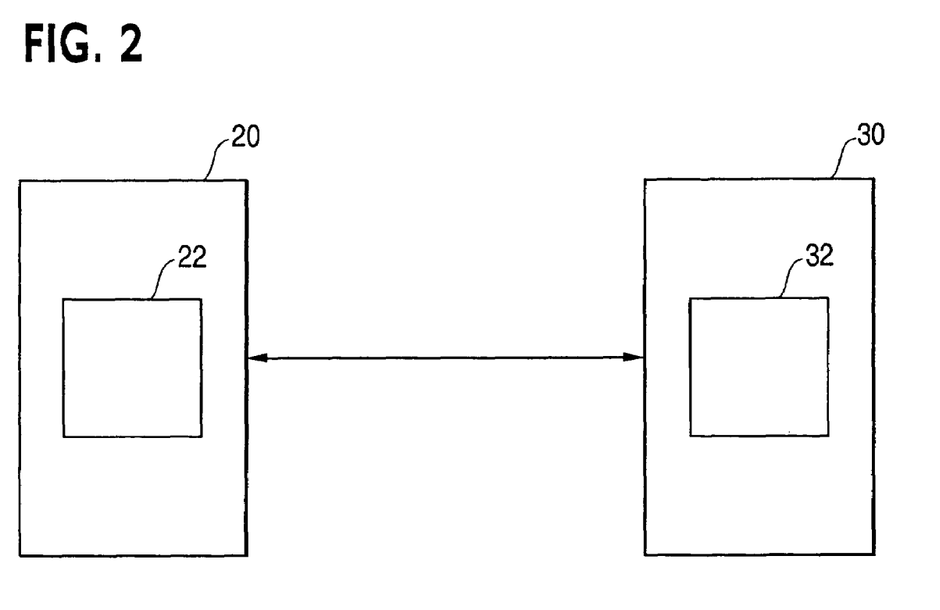
FIG. 2 is an example of two terminal devices that communicate according to an example embodiment of the present invention.

FIG. 2 shows an example of how information may be communicated between two terminal devices 20 and 30. The first terminal device 20 may include a compressor/decompressor (hereafter called compressor 22) and the second terminal device 30 may also include a decompressor/compressor (hereafter called decompressor 32). Compression and decompression may occur during the communication between the two entities or between any entities that transfer data between each other. For example, header compression may be used between two entities that are connected with a bandwidth limited link (e.g., a radio link). An example of this may be between a mobile node and a base station. The first terminal device 20 and the second terminal device 30 may each include a transmitting/receiving device to transmit/receive signals from one another. The first terminal device 20 and the second terminal device 30 may also both include an encoding/decoding device to perform various encoding/decoding techniques. Operations performed by the devices, as will now be described, may be performed by any one or any combination of the compressor/decompressor, the encoding/decoding device and the transmitting/receiving device.

As will be described below in greater detail, compression of a current item list (i.e., curr_list) may be based on a reference item list (i.e., ref_list) that was previously sent from the terminal device 20 (by the compressor 20) and received at the terminal device 30 (by the decompressor 32). In at least one embodiment, any difference between the current item list and the reference item list may be encoded and sent in a compressed item list. In at least another embodiment, a difference between one item in the current item list and a corresponding item in the reference item list may be encoded and sent in a compressed item in a compressed item list from the terminal device 20 to the terminal device 30.

The reference item list (ref_list) may be chosen by any one of various means. One approach may be based on acknowledgment. For example, the compressor 22 may choose the latest item list that is acknowledged by the decompressor 32 as the reference item list. In order to identify the reference item list that will be used for the compression, a reference identifier (i.e., ref_id) may be provided within the compressed item list. A real-time protocol (RTP) sequence number is an example of a reference identifier.

Embodiments of the present invention may achieve higher efficiency by encoding and sending the difference between the current item list (curr_list) and the reference item list (ref_list), and by encoding and sending the difference between an item in the current item list and an item in the reference item list. High compression efficiency may be achieved when the size of the current item list is large but only a small portion of the data is changed. The use of a reference item list may provide the required robustness against errors occurring between the compressor 22 and the decompressor 32.

Embodiments of the present invention may provide three different types of transformation cases. Other embodiments, configurations and numbers of transformation cases are also within the scope of the present invention. A given item in the current item list (curr_list) may be classified as belonging to one of three transformation cases: transformation case A, transformation case B or transformation case C.

In transformation case A, a given item in the current item list (curr_list) is in the reference item list (ref_list), and the contents of these two items are the same. The position of the item in the current item list and the reference item list may or may not be the same. In transformation case B, for the given item in the current item list (curr_list), there is a similarly structured item in the reference item list (ref_list). However, the contents of the item in the current item list and the item in the reference item list are not identical. The position of the item in the current item list and the item in the reference item list may or may not be the same. Finally, in the transformation case C, the given item in the current item list is not in the reference item list.

For the given item in the current item list, the compressor 22 may determine which one of the transformation cases applies. That is, the compressor 22 may determine whether transformation case A applies, whether transformation case B applies, or whether transformation case C applies. Depending on this determination, a different encoding scheme may be used for the communication to the second terminal device.

Figure 3:
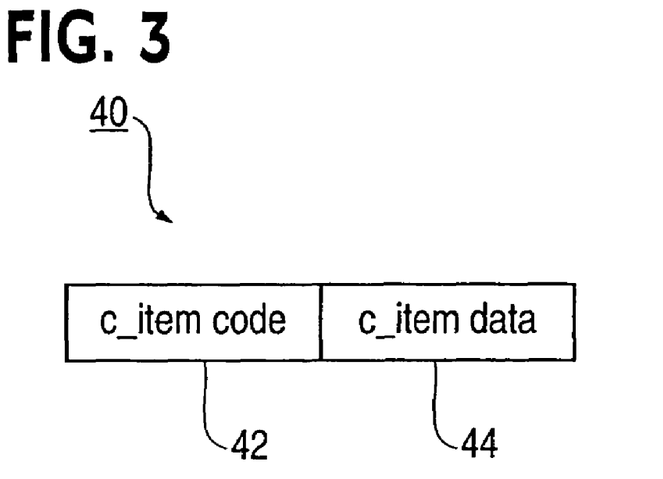
FIG. 3 shows a compressed item according to an example embodiment of the present invention.

A given item in current item list may be compressed using an item in the reference item list as a reference. A compressed item may be referred to as c_item. FIG. 3 shows an example of a compressed item 40 that includes a c-item code (CC) field 42 followed by a c_item data field 44.

For different compressed item codes, contents of the c_item data field 44 may be different. Three different types of compressed item codes and their respective compressed item data may be defined as follows: (1) a c_item code of "0"; (2) a c_item code of "10"; and (3) a c_item code of "11".

Figure 4:
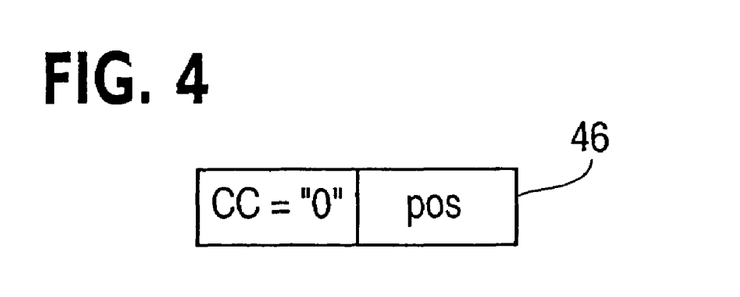
FIG. 4 shows a compressed item having a compressed item code of "00" according to an example embodiment of the present invention.

A c_item code of "0" may be used for an item classified as belonging to the transformation case A. The structure of the compressed item 40 having a c_item code of "0" may be as shown in FIG. 4. Data within a pos field 46 (i.e., the c_item data) may indicate a position of the item in the reference item list. When the decompressor 32 receives such a compressed item, the decompressor 32 may retrieve the item from the reference item list at the position "pos" and copy the item into the current item list.

The count of "pos" may start at 0. That is, the position of the first item in the list may be 0. Since the pos field 46 in the c_item data field 44 indicates the position of the item in the reference item list, the length of the pos field 46 may depend on the actual number of items in the reference item list. For example, assuming that there are k items in the reference item list, then the number of bits for the pos field 46 may be the ceiling of (log 2(k+1)). More specifically, if there are seven items in the reference item list, then three bits may be used for the pos field 46. Since the number of items in the reference item list is known to both the compressor 22 and the decompressor 32, both the compressor 22 and the decompressor 32 are aware of the number of bits used in the pos field 46. Accordingly, the length of the pos field 46 does not need to be carried in the compressed list.

Figure 5:
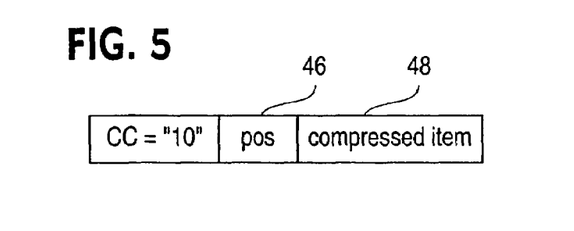
FIG. 5 shows a compressed item having a compressed item code of "10" according to an example embodiment of the present invention.

A c_item code of "10" may be used for an item classified as belonging to the transformation case B. The structure of the compressed item 40 having the c_item code of "10" may be as shown in FIG. 5. Data within a compressed item field 48 (i.e., the c_item data) may carry a compressed value of the item in the current item list using an item in the reference item list as the reference. The compression technique may be dependent on the item and may be predefined. The position of the item inside the reference item list may be carried in the pos field 46. When the decompressor 32 receives such a compressed item, the decompressor 32 may retrieve the item at the position "pos" in the reference item list and use it as the reference to decompress the compressed item. If the item itself is a list, then the compression scheme may apply to compress the item.

Figure 6:
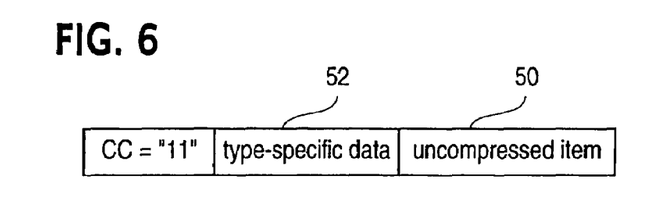
FIG. 6 shows a compressed item having a compressed item code of "11" according to an example embodiment of the present invention.

A c_item code of "11" may be used for an item classified as belonging to transformation case C. The structure of the compressed item 40 having the c_item code of "11" may be as shown in FIG. 6. Data within an uncompressed item field 50 (i.e., the c_item data) may contain an original value of the item in the current item list. A type-specific data field 52 may contain some additional information used to reconstruct the item list. The presence and the content of the type-specific data field 52 may depend on the item and should be predefined. For example, if the length of each item on the list varies from each other and cannot be obtained from the information inside the item, then a length field may be included within the type-specific data field 52. When the decompressor 32 receives such a compressed item, it may copy the uncompressed item field 50 into the current item list.

List compression will now be described with respect to seven encoding schemes. Other types of list compression, encoding schemes, and number of encoding schemes are also within the scope of the present invention. As will be described, an encoding type field (ET) may be included within the compressed list to identify an encoding scheme used for the list compression. The following different types of encoding schemes will be described: (1) a generic scheme; (2) an insertion only encoding scheme; (3) a removal only encoding scheme; (4) an insertion and removal only encoding scheme; (5) a content change only encoding scheme; (6) an insertion and content change only scheme; and (7) a removal and content change only scheme.

Figure 7:
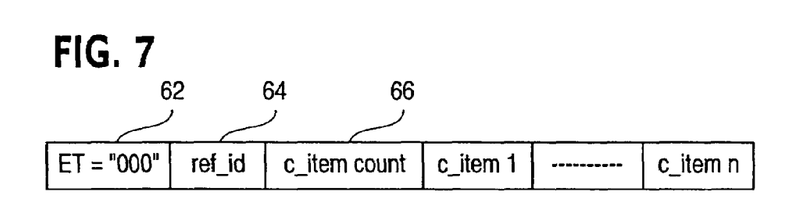
FIG. 7 shows a compressed item having a generic encoding scheme according to an example embodiment of the present invention.

The generic encoding scheme will first be described with respect to FIG. 7. A generic encoding scheme addresses the situation where the items belong to a mixture of transformation cases. For example, item 1 in a current item list may belong to transformation case B, item 2 may belong to transformation case C, and item 3 may belong to transformation case A. The structure of a compressed item using the generic encoding scheme may be as shown in FIG. 7. The encoding type (ET) field 62 for the generic encoding scheme may be defined as "000". The reference identifier field 64 may contain the reference identifier such as the RTP sequence number. The number of compressed items in the compressed item list (i.e., c_item 1, ..., c_item n) may be carried in the c_item count field 66. Each compressed item may correspond to one of the items (i.e., item i) in the current item list. Accordingly, the order of the compressed items represents the order of the items in the current item list.

Figure 8:
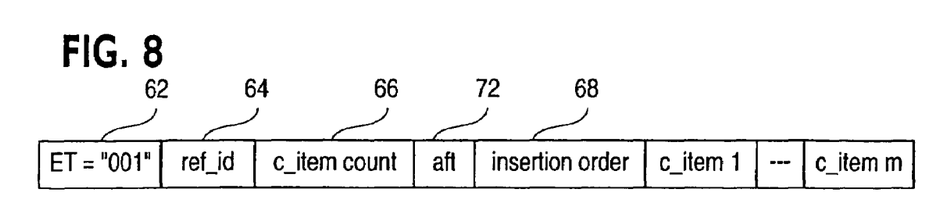
FIG. 8 shows a compressed item having an insertion only encoding scheme according to an example embodiment of the present invention.

An insertion only encoding scheme will now be described with respect to FIG. 8. This insertion only encoding scheme addresses the situation where all the items are classified as belonging to either transformation case C or transformation case A. FIG. 8 shows the structure of the compressed item list.

The encoding type (ET) field 62 for the insertion only encoding scheme may be defined as "001". A c_item count field 66 may contain the number of compressed items in the compressed item list (i.e., c_item 1, ..., c_item m). Each compressed item in the compressed item list may correspond to a new item in the compressed item list as compared with the reference item list. An insertion order field 68 may specify the position of the newly added items. Two formats of the insertion order field 68 may be used. For example, an '0' in an aft field 72 may indicate that a bit mask format is used, whereas a "1" in the aft field 72 may indicate that a position list format is used. Selection of the format may depend on the encoding efficiency. If the number of items in the reference item list is large and only a few items are added in the current item list, then the position list format is preferably used; otherwise, the bit mask format may be used. These types of formats are merely example embodiments as other formats are also within the scope of the present invention.

The bit mask format will now be described with respect to the insertion only encoding scheme. In this format, a bit mask may be used to specify a position of the added item. To construct the bit mask and the following compressed item list at the compressor 22, a list of '0' and an empty compressed item list may be generated as the starting point. This may be called a "0" list. The number of '0's in the '0' list may be equal the number of items in the reference item list. The position of each '0' in the '0' list may correspond to the reference item list. That is, the i-th '0' in the '0' list may correspond to the i-th item in the reference item list. Comparing the current item list with the reference item list, if a new item is added between the i-th item and the (i+1)-th item in the reference item list, then a '1' may be inserted between the i-th '0' and (i+1)-th '0' in the original '0' list. The compressed item that carries the new item may be added to the end of the compressed item list. This procedure may be repeated until all the added items have been processed. The length of the bit mask may equal the number of items in the reference item list plus the number of items added into the list. Since the number of items in the reference item list is known to both the compressor 22 and the decompressor 32, and the number of added items is carried in the c_item count field 66, then the length of the bit mask does not need to be carried in the compressed item list.

When the decompressor 32 receives the bit mask, it may scan the bit mask from left to right. When a '0' is observed, the decompressor 32 may copy the corresponding item in the reference item list into the current item list. On the other hand, when a '1' is observed, the decompressor 32 may decompress the corresponding compressed item in the current item list and add it into the current item list.

Figure 9:
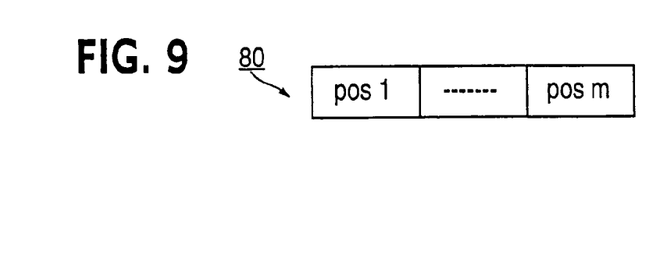
FIG. 9 shows a structure of a position list according to an example embodiment of the present invention.

The position list format will now be described. In this format, a list of position fields may be carried in the insertion order field 68. FIG. 9 shows one structure of a position list 80. The i-th field in the position list 80 may correspond to the i-th compressed item in the compressed item list. The value of pos i may indicate the position of the item in the reference item list, before which the added item i should be inserted. The added item i may be obtained from the c_item i. If two or more position fields have the same value (i.e., multiple items are added before a certain item in the reference item list), then a sequence of the added item may depend on the sequence of the respective compressed items with the same position value in the compressed item list.

When the decompressor 32 receives the position list 80, the decompressor 32 may first retrieve all the items in the reference item list. Then, for each compressed item in the compressed item list, the decompressor 32 may obtain the uncompressed value and insert it into the reference item list at the position indicated in the corresponding position field in the position list 80.

Figure 10:
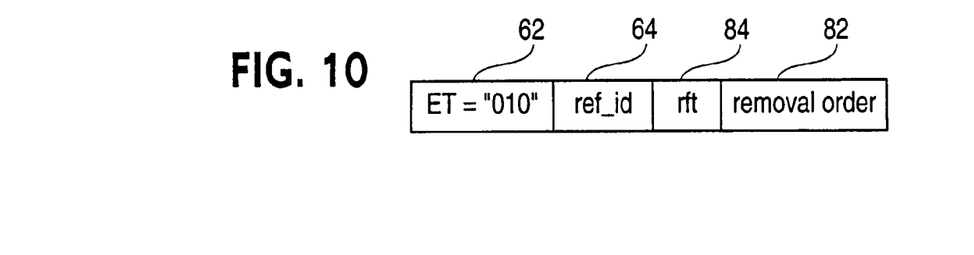
FIG. 10 shows a compressed item having a removal only encoding scheme according to an example embodiment of the present invention.

A removal only encoding scheme will now be described. The removal only encoding scheme addresses the situations where certain items exist in the reference item list but do not exist in the current item list. FIG. 10 shows a structure of the compressed item list.

The encoding type (ET) field 62 may be defined as "010" for the removal only encoding scheme. A removal order field 82 may contain information regarding which item in the reference item list is not currently in the current item list. Two formats of the removal order field 82 may be used. For example, a '0' in a rft field 84 may indicate that a bit mask format is used, whereas a '1' in the rft field 84 may indicate that a position list format is used. Selection between these formats may depend on the encoding efficiency. If the number of items in the reference item list is small and/or the number of items removed from the reference item list is large, then the bit mask format is preferably used; otherwise the position list format may be used.

The bit mask format will now be described with respect to the removal only encoding scheme. In this format, a removal bit mask may be used. The length of the removal bit mask may equal the number of items in the reference item list. A '1' in the i-th bit in the removal bit mask may indicate that the i-th item in the reference item list is not included in the current item list, whereas a '0' may indicate that it is still present in the current item list. Since the number of items in the reference item list is known to both the compressor 22 and the decompressor 32, the length of the bit mask does not need to be sent in the compressed list.

Figures 11, 12:
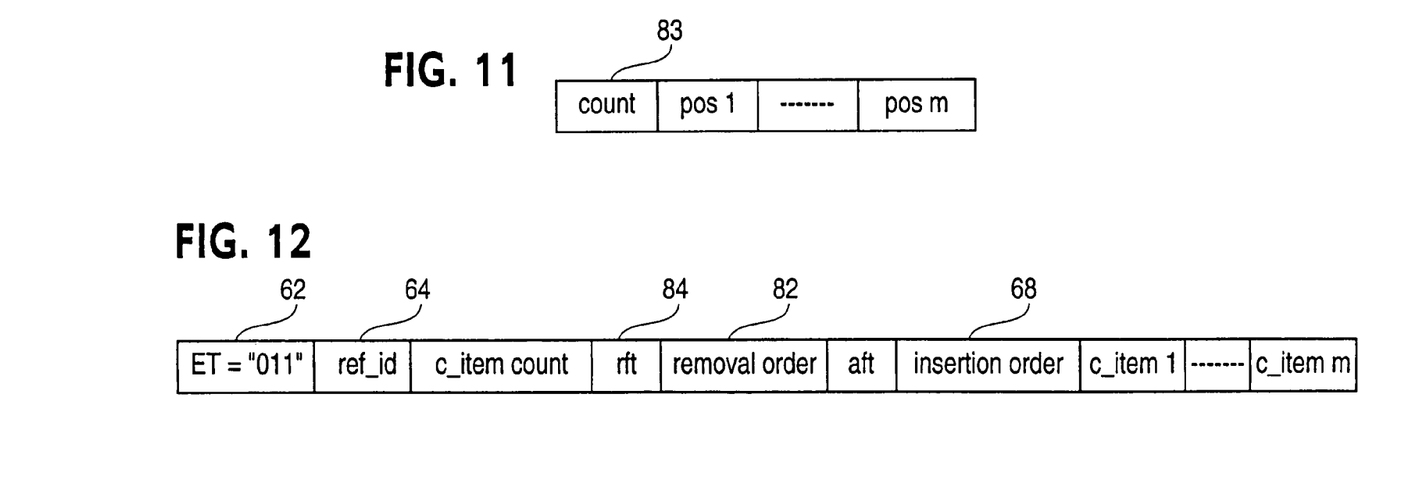
FIG. 11 shows a list of position fields and a count field according to an example embodiment of the present invention.
FIG. 12 shows a compressed item having an insertion and removal only encoding scheme according to an example embodiment of the present invention.

The position list format will now be described with respect to the removal only encoding scheme. In this format as shown in FIG. 11, a list of position fields (i.e., pos 1, ..., pos m) and a count field 83 may be included. Each position field may carry the position of an item in the reference item list that no longer exists in the current item list. The count field 83 may carry the number of position fields in the position list.

An insertion and removal only encoding scheme will now be described with respect to FIG. 12. The insertion and removal only encoding scheme accommodates the transformation cases addressed in the insertion only encoding scheme and the removal only encoding scheme. FIG. 12 shows a structure of the compressed item list 5 that is a combination of the structure used in the insertion only encoding scheme and the structure used in the removal only encoding scheme. The encoding type (ET) field 62 may be defined as "011" for the insertion and removal only encoding scheme. The remaining fields relate to their similarly named fields in the insertion only encoding scheme and the removal only encoding scheme.

Unlike the insertion order field in the insertion only encoding scheme, the insertion order field 68 in the insertion and removal only scheme may be based on the items remaining in the reference item list after the removal has been processed. When the decompressor 32 receives such a compressed list, the decompressor 32 may apply the removal before the insertion.

Figures 13, 14:
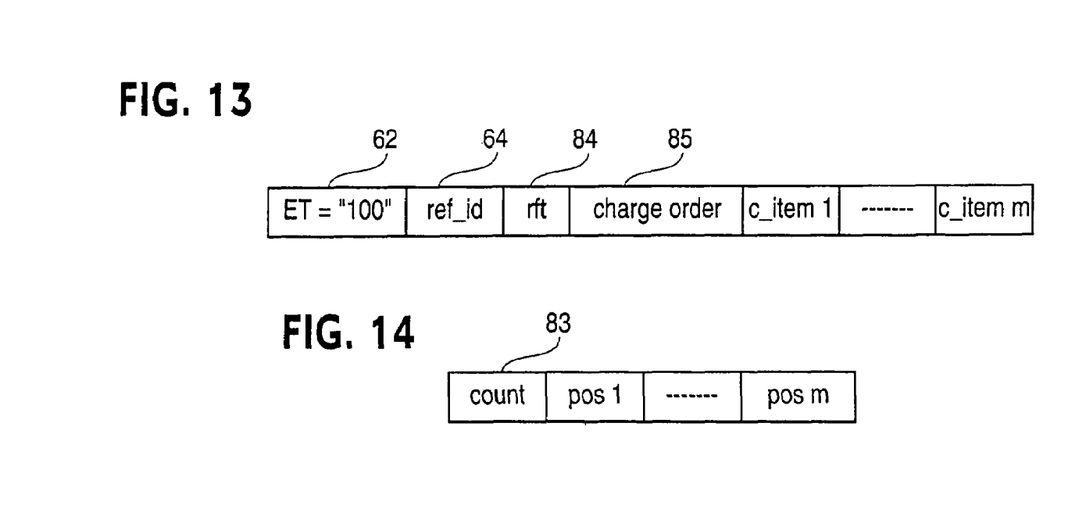
FIG. 13 shows a compressed item having a content change only encoding scheme according to an example embodiment of the present invention.
FIG. 14 shows a count field and a list of position fields according to an example embodiment of the present invention.

A content change only encoding scheme will now be described with respect to FIG. 13. The content change only encoding scheme addresses the situation where the number of items in the list and the ordering are not changed; however, the content of one or more items is changed. FIG. 13 shows a structure of the compressed item list.

The encoding type (ET) field 62 may be defined as "100" for the content change only encoding scheme. The rft field 84 may specify the format used in a change order field 85. For example, a '0' in the rft field 84 may indicate that a bit mask is used, whereas a '1' in the rft field 84 may indicate that a position list field is used. The change order field 85 may specify the position of the items whose content is changed. Two formats can be used. In the bit mask format, a change bit mask is included. A '1' in the i-th bit in the change bit mask means that the i-th item in the reference item list is not identical to the i-th item in the current item list, whereas a '0' means that the i-th item in the reference item list is identical to the i-th item in the current item list. Assuming the number of items in the reference item list is k, then the length of the change bit mask equals k. Since k is known to both the compressor 22 and the decompressor 32, it doesn't need to be sent in the compressed list.

In the position list format, a list of position fields as well as a count field is included. FIG. 14 shows the structure of this format. The count field 83 may carry the number of position fields in the position list, which is assumed to be m. A value '0' in the count field 83 may mean that all the items are changed and no position field is included. Assuming that the number of items in the reference item list is k, then the length of the count field 83 may have a ceiling of (log 2(k)). Each position field may carry the position of an item in the reference item list, whose value is not identical with the item at the same position in the current item list. The length of position list may be m* ceiling(log 2(k)).

Selection between these two formats may depend on the encoding efficiency. If the number of items that have content change is small, then the bit mask format may be more favorable; otherwise, the position list format may be more efficient.

Figure 15:
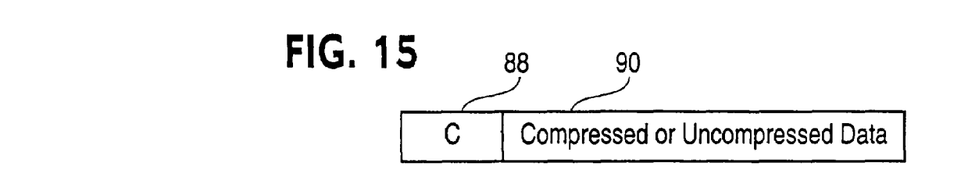
FIG. 15 shows a compressed item according to an example embodiment of the present invention.

Each compressed item in the compressed item list may correspond to the item whose content is changed when comparing with the item at the same position in the reference item list. Their positions in the current item list may be represented in the change order field 85. When the position list format is used in the change order field 85 and the count field 83 is '0' then the order of compressed items is the same as the item order in the reference item list. FIG. 15 shows the structure of the compressed item. The C bit field 88 may specify the format of the compressed or uncompressed data field 90. A '0' in the C bit field 88 may indicate that the uncompressed value of the item is sent, whereas a '1' in the C bit field 88 may indicate that the compressed value of the item is carried. The item in the current item list may be compressed using the item at the same position in the reference item list as the reference. The compression technique may be dependent on the item and should be predefined.

Figure 16:
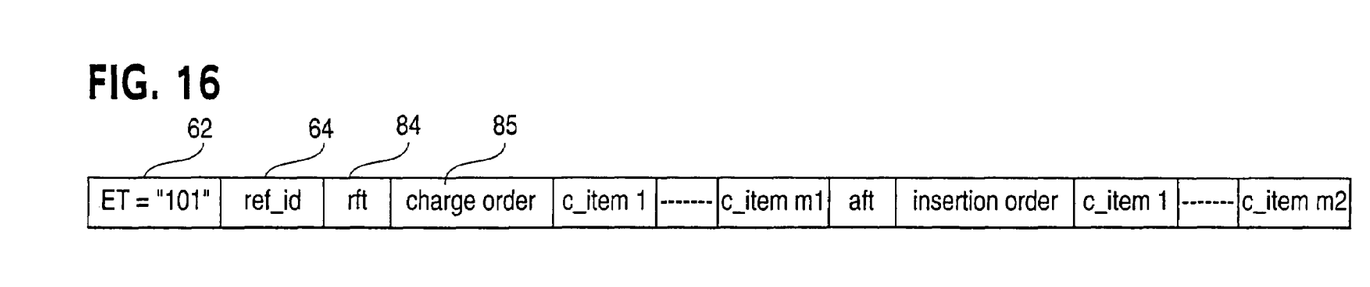
FIG. 16 shows a compressed item according to an example embodiment of the present invention.

An insertion and content change only encoding scheme will now be described. The insertion and content change only encoding scheme addresses the situations where: 1) all the items in the reference item list are also in the current item list, 2) new items are added to the current item list, 3) the relative order of the items that are in both the reference item list and the current item list remains the same, and 4) the content of one or more of these items have been changed. FIG. 16 shows the structure of the compressed item list.

The encoding type (ET) field 62 may be defined as "101" for the insertion and content change only encoding scheme. The remaining fields have been defined in the insertion only encoding scheme and the content change only encoding scheme. The change order field 85 in this scheme is based on the items in the reference item list and the items in the current item list, excluding the newly inserted items. When the decompressor 32 receives such a compressed list, it applies the content change before the insertion.

Figure 17:
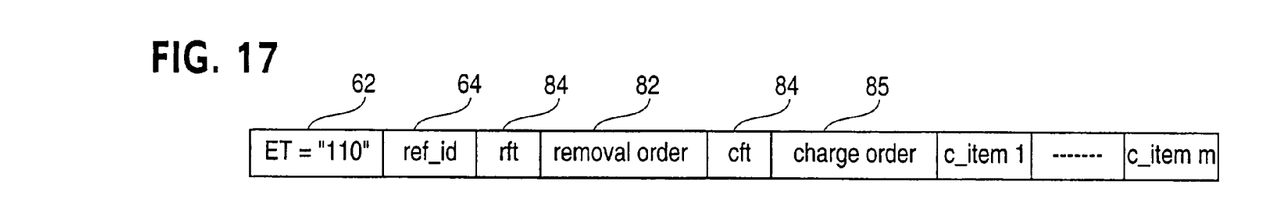
FIG. 17 shows a compressed item according to an example embodiment of the present invention.

A removal and content change only encoding scheme will now be described. The removal and content change only encoding scheme addresses the situation where: 1) some items in the reference item list are not in the current item list, and 2) the content of one or more items that are in both the reference item list and the current item list is changed, but the relative order of these items remains the same. FIG. 17 shows the structure of the compressed item list.

The encoding type (ET) field 62 may be defined as "110" for the removal and content change only encoding scheme. The remaining fields have been discussed above with respect to the removal only scheme and the content change only scheme. The change order field 85 in this scheme may be based on the items in the current item list and the items in the reference item list after the removal is processed. When the decompressor 32 receives such a compressed list, it applies the removal before the content change.

The following examples illustrate the operation of item list compression under different transformation cases. For these examples, there is not any type-specific data needed for the decompression.

A first example will now be described of the insertion and removal only encoding scheme. The items and the order of these items in the current item list are as follows:
current item list: A, B, C, D
reference item list: B, C, X.

Figure 18:
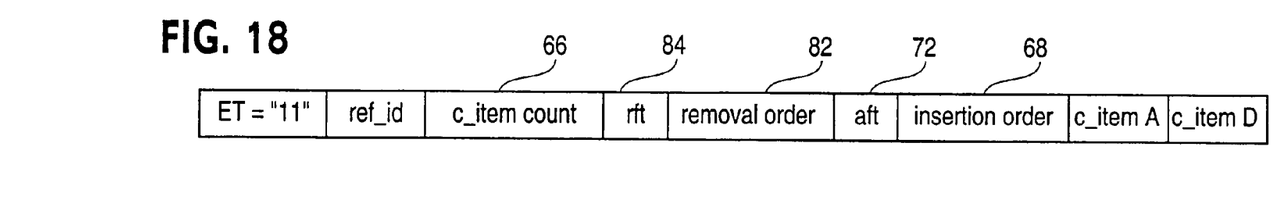
FIG. 18 shows an example of a compressed item list.

By comparing the current item list with the reference item list, it can be determined that A and D are added to the list and X is removed from the list. No change has occurred in the order and the content for B and C. Thus, the format for the insertion and removal only encoding scheme can be used. FIG. 18 shows the compressed item list format for this example.

Since only the compressed items for A and D are included, then the compressed item count in the c_item count field 66 equals two. Assuming both A and D are sent uncompressed, therefore the compressed item for A is "11" plus uncompressed A and the compressed item for D is "11" plus uncompressed D. Assuming that the bit mask format is used for the removal order, then the rft in the rft field 84 equals '0' and the removal order in the removal order field 82 is "001" where the bits (from left to right) correspond to B, C and X, respectively. The '1' corresponding to X indicates that X is removed. If the position list format is used for the insertion order, then aft in the aft field 72 equals '1', and the insertion order in the insertion order field 68 is "0010". The first two bits "00" indicate that item A is added before the item at position "00" in the reference item list (which is B). The following two bits "10" indicate item D is added before position "10" in the reference item list after the removal is processed (which is after item B).

A second example will now be described of the insertion, removal, change of content and reordering. The items and the order of these items in the current item list and the reference item list are as follows:
current item list: A, C, B', D
reference item list: B, C, X.

Figure 19:
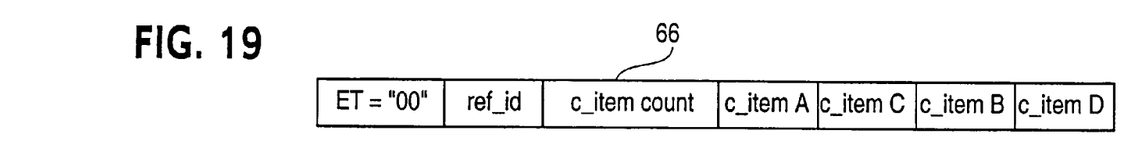
FIG. 19 shows an example of a generic item list compression format.

By comparing the current item list with the reference item list, it can be determined that A and D are added into the list and X is removed from the list. The order of B and C has changed and the content of B has also changed. FIG. 19 shows a generic item list compression format for this example.

Figure 20:
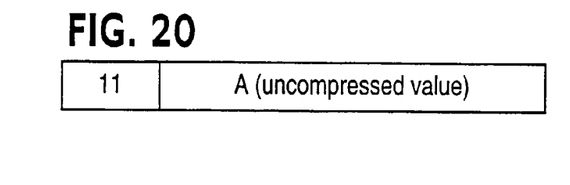
FIG. 20 shows an example of a compressed item.
Figure 21:
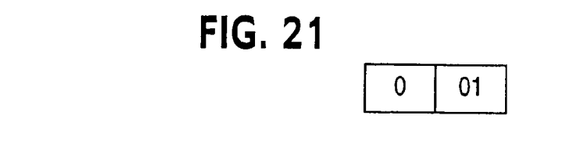
FIG. 21 shows an example of a compressed item.
Figure 22:
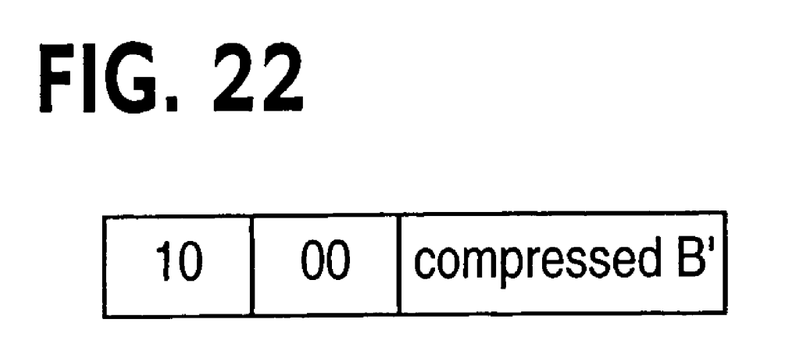
FIG. 22 shows an example of a compressed item.
Figure 23:
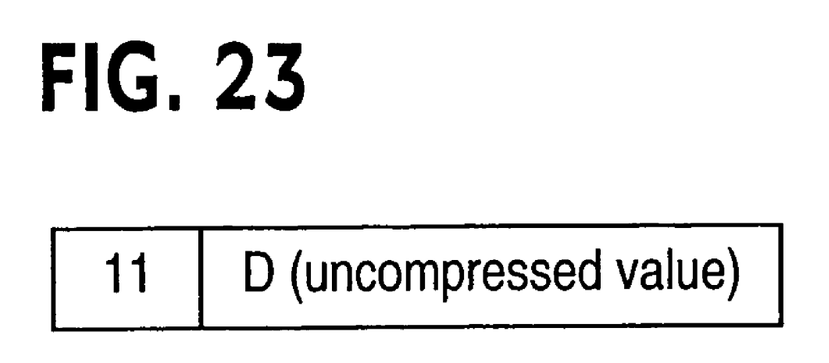
FIG. 23 shows an example of a compressed item.

In this example, the compressed item count in the c_item count field 66 equals four. Additionally, the c_item A may include the fields shown in FIG. 20, and the c_item C may include the fields shown in FIG. 21. In FIG. 21, the "01" may represent the position of C in the reference item list. Further, the c_item B may include the fields shown in FIG. 22. In FIG. 22, the "00" may represent the position of B in the reference item list. The compressed B' may contain the compressed value of B' using B in the reference item list as the reference. The c_item D may include the fields shown in FIG. 23.

In embodiments described above, it is assumed that a given item in the current item list can be uniquely classified as belonging to one of a plurality of transformation cases. There are other possibilities for doing the classification. One example follows, although others are also within the scope of the present invention.

For a given item (item X) in the current item list, there is no item in the reference item list that has the identical value. However, one item (i.e., item Y) in the reference item list may have the similar value to item X. Therefore, item X can be classified as belonging to either transformation case B or transformation case C. An example of this type of list is CSRC list in RTP headers.

The compressor 22 may decide to use the transformation case in which the encoding scheme will yield the highest compression efficiency. In the above example, we will assume that item X includes L_x bits. If item X is classified as belonging to transformation case A and the compressed item code "11" is used, then the compressed item for item X may include (L_x+2) bits. If item X is classified as belonging to transformation case B and the compressed item code "10" is used (assuming that the length of the position field is L_pos and the length of compressed item X when using item Y as the reference is D_xy), then the compressed item X may include (L_pos+D_xy+2) bits. Thus, if (L_pos+D_xy) is larger than L_x, then transformation case B may be used. On the other hand, if (L_pos+D_xy) is not larger than L_x, then transformation case A may be used.

While the invention has been described with reference to specific embodiments, the description of the specific embodiments is illustrative only and is not to be considered as limiting the scope of the invention. That is, various other modifications and changes may occur to those skilled in the art without departing from the spirit and scope of the invention.

What is claimed is:

1. A method, comprising:
communicating packet header information;
comparing, at a communication device, a current item list containing a plurality of current items of said packet header with a reference item list containing a plurality of reference items, wherein said comparing determines a difference between said current item list and said reference item list;
determining a type of classification of the current item list based on said comparing the current item list and the reference item list, wherein said type of classification is based on at least one of: whether an item in said reference item list is in said current item list, whether said item is in said reference item list, and whether contents of said item in said current item list are the same as contents of said item in said reference item list;
encoding information regarding said difference prior to sending said information from a first entity to a second entity, wherein encoding said information comprises a combination of at least one of the following: encoding information regarding a position of a newly added item to said reference item list, encoding information regarding which item in said reference item list is not in said current item list, and encoding information regarding content of at least one item in said reference item list; and using the determined type of classification to control the communication and compression of the packet header information, wherein the classification of the current item list associates the current item list with at least one of a plurality of different predetermined encoding schemes.

2. The method of claim 1, wherein the communication of the information further comprises sending information regarding said difference from a first entity to a second entity.

3. The method of claim 1, wherein encoding said information comprises encoding information regarding a position of a newly added item to said reference item list.

4. The method of claim 1, wherein encoding said information comprises encoding information regarding which item in said reference item list is not in said current item list.

5. The method of claim 1, wherein encoding said information comprises encoding information regarding content of at least one item in said reference item list.

6. The method of claim 1, wherein the communicating information further comprises sending a compressed list from a first entity to a second entity.

7. The method of claim 6, wherein said compressed list includes information regarding a difference between said current item list and said reference item list.

8. The method of claim 7, wherein said difference is encoded within said compressed list based on said determined type of classification.

9. The method of claim 8, wherein said information further comprises a type of encoding.

10. The method of claim 9, wherein said type of encoding comprises one of an insertion encoding scheme, a removal encoding scheme and a content change encoding scheme.

11. The method of claim 1, further comprising sending information regarding a difference between an item in said current item list and a corresponding item in said reference item list.

12. The method of claim 1, wherein the communicating further comprises sending said reference item list from a first entity to a second entity.

13. A method, comprising:
classifying a current item list containing a plurality of items of a packet header by comparing, at a communication device, the current item list with a reference item list containing a plurality of items, wherein said comparing determines a difference between said current item list and said reference item list;
determining a type of classification of the current item list based on said comparing of the current item list with the reference list, wherein the classification of the current item list associates the current item list with at least one of a plurality of different predetermined encoding schemes, wherein said type of classification is based on at least one of: whether an item in said reference item list is in said current item list, whether said item is in said reference item list, and whether contents of said item in said current item list are the same as contents of said item in said reference item list;
based upon the classifying of the at least one item of the current item list, forming a compressed list, wherein said compressed list includes information regarding a difference between the current item list and the reference item list;

encoding information regarding said difference within said compressed list based on said classifying prior to transmitting said information from a first entity to a second entity; and transmitting said compressed list.

14. The method of claim 13, wherein the transmitting the compressed list further comprises transmitting information regarding said difference from a first entity to a second entity.

15. The method of claim 13, wherein encoding said information comprises encoding information regarding a position of a newly added item to said reference item list.

16. The method of claim 13, wherein encoding said information comprises encoding information regarding which item in said reference item list is not in said current item list.

17. The method of claim 13, wherein encoding said information comprises information regarding content of at least one item in said reference item list.

18. The method of claim 13, wherein said information comprises a type of encoding.

19. The method of claim 13, wherein the sending the compressed list further comprises sending said reference item list from a first entity to a second entity.

20. An apparatus, comprising:
at least one processor configured to compare a current item list containing a plurality of current items of a packet header with a reference item list containing a plurality of reference items, wherein said comparing determines a difference between said current item list and said reference item list, to determine a type of classification of the current item list based on said comparing of the current item list and the reference item list, wherein said type of classification is based on at least one of: whether an item in said reference item list is in said current item list, whether said item is in said reference item list, and whether contents of said item in said current item list are the same as contents of said item in said reference item list, to encode information regarding said difference prior to transmitting said information from said apparatus to another entity based on said determined type of classification, and to transmit compressed information based upon the determined type of classification, wherein the classification of the current list associates items in the current item list with at least one of a plurality of different predetermined encoding schemes.

21. The apparatus of claim 20, further comprising a transmitter configured to transmit information regarding said difference from said apparatus to another entity.

22. The apparatus of claim 20, further comprising a transmitter configured to transmit a compressed list from said apparatus to another entity.

23. The apparatus of claim 22, wherein said compressed list includes information regarding a difference between said current item list and said reference item list.

24. An apparatus, comprising:
at least one processor configured to classify at least one item of a current item list containing a plurality of items of a packet header by comparing the current item list with a reference item list containing a plurality of items and based upon the classifying of the at least one item of the current item list to form a compressed list including said at least one item, wherein said comparing determines a difference between said current item list and said reference item list, wherein said at least one processor is configured to determine a type of classification of the current item list based on said comparing, wherein said type of classification is based on at least one of: whether an item in said reference item list is in said current item list, whether said item is in said reference item list, and whether contents of said item in said current item list are the same as contents of said item in said reference item list;

an encoder configured to encode information regarding said difference prior to transmitting said information from said apparatus to another entity based on said determined type of classification, and wherein the classification of the current item list associates the current item list with at least one of a plurality of different predetermined encoding schemes, wherein said encoder is configured to perform a combination of at least one of the following: encoding information regarding a position of a newly added item to said reference item list, encoding information regarding which item in said reference item list is not in said current item list, and encoding information regarding content of at least one item in said reference item list; and a transmitter configured to transmit said compressed list.

25. The apparatus of claim 24, wherein said transmitter is configured to transmit information regarding said difference between said current item list and said reference item list from said apparatus to another entity.

26. The apparatus of claim 24, wherein said encoder is configured to encode information regarding a position of a newly added item to said reference item list.

27. The apparatus of claim 24, wherein said encoder is configured to encode information regarding which item in said reference item list is not in said current item list.

28. The apparatus of claim 24, wherein said encoder is configured to encode information regarding content of at least one item in said reference item list.

29. The apparatus of claim 24, wherein said compressed list includes information regarding a difference between a current item list and a reference item list.

30. The apparatus of claim 29, wherein said difference is encoded within said compressed list based on said classifying.

31. An apparatus, comprising:
comparing means for comparing a current item list containing a plurality of current items of a packet header with a reference item list containing a plurality of reference items, wherein said comparing determines a difference between said current item list and said reference item list;

determining means for determining a type of classification of the current item list based on a comparing of the current item list and the reference item list, wherein said type of classification is based on at least one of: whether an item in said reference item list is in said current item list, whether said item is in said reference item list, and whether contents of said item in said current item list are the same as contents of said item in said reference item list;

encoding means for encoding said information regarding said difference within said compressed list prior to transmitting said information from said apparatus to another entity based on said determined type of classification, wherein said encoding performs a combination of at least one of the following: encoding information regarding a position of a newly added item to said reference item list, encoding information regarding which item in said reference item list is not in said current item list, and encoding information regarding content of at least one item in said reference item list; and communicating means for communicating compressed packet header information based upon a determined type of classification, wherein the classification of the current item list associates the current item list with at least one of a plurality of different predetermined encoding schemes.

32. A method, comprising:
receiving, at a communication device, packet header information generated by a process in which a current item list containing a plurality of current items of said packet header is compared with a reference item list containing a plurality of reference items, wherein said comparing determines a difference between said current item list and said reference item list, a type of classification of the current item list is determined based on said comparing of the current item list and the reference item list, wherein said type of classification is based on at least one of: whether an item in said reference item list is in said current item list, whether said item is in said reference item list, and whether contents of said item in said current item list are the same as contents of said item in said reference item list, and said process encoding said information regarding said difference within said compressed list prior to transmitting said information from said apparatus to another entity based on said determined type of classification, wherein said encoding performs a combination of at least one of the following: encoding information regarding a position of a newly added item to said reference item list, encoding information regarding which item in said reference item list is not in said current item list, and encoding information regarding content of at least one item in said reference item list, the determined type of classification is used to control the communication and compression of the packet header information, wherein the classification of the current item list associates the current item list with at least one of a plurality of different predetermined encoding schemes; and decompressing the received header information.

33. The method of claim 32, wherein the received header information comprises information sent from a first entity to a second entity.

34. The method of claim 32, further comprising:
receiving said reference item list.

35. The method of claim 34, wherein said decompressing is performed using said received reference item list as a reference.

36. An apparatus, comprising:
a receiver configured to receive packet header information generated by a process in which a current item list containing a plurality of current items of said packet header is compared with a reference item list containing a plurality of reference items, wherein said comparing determines a difference between said current item list and said reference item list, a type of classification of items in the current item list is determined based on said comparing the current item list and the reference item list, wherein said type of classification is based on at least one of: whether an item in said reference item list is in said current item list, whether said item is in said reference item list, and whether contents of said item in said current item list are the same as contents of said item in said reference item list, and said process encoding said information regarding said difference within said compressed list prior to transmitting said information from said apparatus to another entity based on said determined type of classification, wherein said encoding performs a combination of at least one of the following: encoding information regarding a position of a newly added item to said reference item list, encoding information regarding which item in said reference item list is not in said current item list, and encoding information regarding content of at least one item in said reference item list, the determined type of classification is used to control the communication and compression of the packet header information wherein the classification of the current item list associates the current item list with at least one of a plurality of different predetermined encoding schemes; and a decompressor configured to decompress the received header information.

37. The apparatus of claim 36, wherein the received header information comprises information sent from a first entity to a second entity.

38. The apparatus of claim 36, wherein the receiver is further configured to receive said reference item list.

39. The apparatus of claim 38, wherein said decompressor is configured to use said received reference item list as a reference.

40. A computer-readable medium configured to store instructions that, when executed, control a processor to perform:

communicating packet header information;

comparing, at a communication device, a current item list containing a plurality of current items of said packet header with a reference item list containing a plurality of reference items, wherein said comparing determines a difference between said current item list and said reference item list;

determining a type of classification of the current item list based on said comparing of the items of the current item list and the reference item list, wherein said type of classification is based on at least one of: whether an item in said reference item list is in said current item list, whether said item is in said reference item list, and whether contents of said item in said current item list are the same as contents of said item in said reference item list;

encoding information regarding said difference prior to sending said information from a first entity to a second entity, wherein encoding said information comprises a combination of at least one of the following: encoding information regarding a position of a newly added item to said reference item list, encoding information regarding which item in said reference item list is not in said current item list, and encoding information regarding content of at least one item in said reference item list; and using the determined type of classification to control the communication and compression of the packet header information, wherein the classification of the current item list associates the current item list with at least one of a plurality of different predetermined encoding schemes.

41. A computer-readable medium configured to store instructions that, when executed, control a processor to perform:

classifying at least one item of a current item list containing a plurality of items of a packet header by comparing, at a communication device, the current item list with a reference item list containing a plurality of items, wherein said comparing determines a difference between said current item list and said reference item list;

determining a type of classification of items in the current classification list based on said comparing of the current item list with the reference item list, wherein the classification of the current item list associates the current item list with at least one of a plurality of different predetermined encoding schemes, wherein said type of classification is based on at least one of: whether an item in said reference item list is in said current item list, whether said item is in said reference item list, and whether contents of said item in said current item list are the same as contents of said item in said reference item list;

based upon the classifying of the at least one item of the current list, forming a compressed list, wherein said compressed list includes information regarding a difference between a current item list and a reference item list;

encoding information regarding said difference within said compressed list based on said classifying prior to transmitting said information from a first entity to a second entity; and transmitting said compressed list.

42. A computer-readable medium configured to store instructions that, when executed, control a processor to perform:

receiving, at a communication device, packet header information generated by a process in which a current item list containing a plurality of current items of said packet header is compared with a reference item list containing a plurality of reference items, wherein said comparing determines a difference between said current item list and said reference item list, a type of classification of items in the current item list is determined based on said comparing of the items of the current item list and the reference item list, wherein said type of classification is based on at least one of: whether an item in said reference item list is in said current item list, whether said item is in said reference item list, and whether contents of said item in said current item list are the same as contents of said item in said reference item list, and encoding said information regarding said difference within said compressed list prior to transmitting said information from said apparatus to another entity based on said determined type of classification, wherein said encoding performs a combination of at least one of the following: encoding information regarding a position of a newly added item to said reference item list, encoding information regarding which item in said reference item list is not in said current item list, and encoding information regarding content of at least one item in said reference item list, the determined type of classification is used to control the communication and compression of the packet header information, wherein the classification of the current item list associates the current item list with at least one of a plurality of different predetermined encoding schemes; and decompressing the received header information.

* * * * *